US012804823B2

(12) United States Patent
Iguchi et al.

(10) Patent No.: US 12,804,823 B2
(45) Date of Patent: Nov. 17, 2026

(54) IN-VEHICLE ELECTRONIC DEVICE

(71) Applicants: Nissan Motor Co., Ltd., Yokohama (JP); Marelli Corporation, Saitama-city (JP)

(72) Inventors: Toyoki Iguchi, Kanagawa (JP); Kohei Kasedo, Kanagawa (JP); Kouichirou Horikoshi, Saitama-city (JP); Katsutoshi Yamauchi, Saitama-city (JP)

(73) Assignees: Nissan Motor Co., Ltd., Yokohama (JP); Marelli Corporation, Saitama (JP)

( * ) Notice: Subject to any disclaimer, the term of this patent is extended or adjusted under 35 U.S.C. 154(b) by 68 days.

(21) Appl. No.: 19/121,327

(22) PCT Filed: Oct. 2, 2023

(86) PCT No.: PCT/JP2023/035941
§ 371 (c)(1),
(2) Date: Apr. 15, 2025

(87) PCT Pub. No.: WO2024/084942
PCT Pub. Date: Apr. 25, 2024

(65) Prior Publication Data

US 2026/0143596 A1 May 21, 2026

(30) Foreign Application Priority Data

Oct. 19, 2022 (JP) ................................ 2022-167691

(51) Int. Cl.
*H05K 5/00* (2025.01)
*H05K 5/06* (2006.01)

(52) U.S. Cl.
CPC ......... *H05K 5/0056* (2013.01); *H05K 5/0069* (2013.01); *H05K 5/061* (2013.01); *H05K 5/069* (2013.01)

(58) Field of Classification Search
CPC .... H05K 5/0056; H05K 5/0069; H05K 5/061; H05K 5/069; H05K 5/068; H01R 12/716; H01R 13/5227
See application file for complete search history.

(56) References Cited

U.S. PATENT DOCUMENTS 6,445,568 B1 9/2002 Baur et al.
6,982,379 B2 * 1/2006 Saka .................. H01R 13/5227 220/374

(Continued)

FOREIGN PATENT DOCUMENTS

CN 216903497 U 7/2022
JP H07-16392 U 3/1995

(Continued)

*Primary Examiner* — Abhishek M Rathod
(74) *Attorney, Agent, or Firm* — Young Basile Hanlon & MacFarlane, P.C.

(57) ABSTRACT

An in-vehicle electronic device includes: a connector into which a retainer is inserted; a circuit board on which the connector is mounted; a case accommodating the circuit board and the connector such that an opening of the connector through which the retainer is inserted is exposed to outside; and a drain mechanism configured to drain water to the outside of the case and provided to face a current-carrying part configured to allow electricity to flow therethrough.

5 Claims, 9 Drawing Sheets

(56) References Cited

U.S. PATENT DOCUMENTS

| | | | | |
|---|---|---|---|---|
| 8,982,583 | B2 * | 3/2015 | Yuasa | H01H 85/24 361/837 |
| 11,791,588 | B2 * | 10/2023 | Yokoyama | B60R 16/0215 439/206 |
| 2004/0007373 | A1 * | 1/2004 | Higuchi | H02G 3/088 174/50 |
| 2009/0163053 | A1 * | 6/2009 | Yamaguchi | H01R 13/5227 439/76.1 |
| 2014/0315421 | A1 * | 10/2014 | Lu | H01R 13/5227 439/519 |
| 2019/0275953 | A1 * | 9/2019 | Mori | B60R 16/0239 |
| 2022/0094102 | A1 * | 3/2022 | Asano | H01R 13/5227 |
| 2022/0099792 | A1 * | 3/2022 | Tkaczyk | B60R 16/0239 |

FOREIGN PATENT DOCUMENTS

| | | | |
|---|---|---|---|
| JP | 2014-003206 | A | 1/2014 |
| JP | 2020-145022 | A | 9/2020 |
| JP | 2022-051487 | A | 3/2022 |

* cited by examiner

IN-VEHICLE ELECTRONIC DEVICE

CROSS-REFERENCE TO RELATED APPLICATION(S)

This application is a national stage 371 application of International Patent Application Serial No. PCT/JP 2023/035941, filed on Oct. 2, 2023, which claims priority to and the benefit of Japanese Patent Application Serial No. 2022-167691, filed Oct. 19, 2022, the entire disclosures of which are hereby incorporated by reference.

TECHNICAL FIELD

The present invention relates to an in-vehicle electronic device.

BACKGROUND

An in-vehicle electronic device disposed in an engine room of a vehicle is disclosed in JP2014-003206A. The in-vehicle electronic device includes a circuit board provided with a connector for input and output, a base (lower case) to which the circuit board is fixed, a cover (upper case) that is fixed to the base and covers the circuit board such that a connection portion of the connector is exposed to the outside, and a waterproof seal that fixes and seals the base and the cover.

SUMMARY

Incidentally, when an in-vehicle electronic device is provided outside a vehicle interior such as an engine room of a vehicle, a structure including a waterproof seal to prevent water from entering the inside is adopted as in the in-vehicle electronic device described in JP2014-003206A, and when the in-vehicle electronic device is provided inside the vehicle interior, a structure for preventing water from entering the inside is often not adopted.

However, even when the in-vehicle electronic device is provided in the vehicle interior, for example, when the vehicle is submerged, water may enter the inside of the in-vehicle electronic device. In a case where the vehicle returns from the submerged state, when water entering the in-vehicle electronic device stays inside the in-vehicle electronic device, a leakage current may flow through a path through which water does not originally flow.

Therefore, even when the in-vehicle electronic device is provided in the vehicle interior, a structure for preventing water from entering the inside may be adopted, but in the structure for preventing water from entering the inside, it is necessary not only to provide a waterproof seal on a housing in order to prevent water from entering the housing, but also to provide a rubber seal or the like in order to prevent entry of water due to a capillary action from a connector pin. Therefore, particularly when the number of connector pins is large, the in-vehicle electronic device may become large.

The present invention has been made in view of such technical problems, and an object thereof is to prevent occurrence of a leakage current and to prevent an increase in size of an in vehicle electronic device.

According to an aspect of the present invention, an in-vehicle electronic device includes: a connector into which a retainer is inserted; a circuit board on which the connector is mounted; a case accommodating the circuit board and the connector such that an opening of the connector through which the retainer is inserted is exposed to outside; and a drain mechanism configured to drain water to the outside of the case and provided to face a current-carrying part configured to allow electricity to flow therethrough.

DETAILED DESCRIPTION

Hereinafter, embodiments of the present invention will be described with reference to the accompanying drawings.

First, an overall configuration of an in-vehicle electronic device (hereinafter, simply referred to as "electronic device") 100 according to an embodiment of the present invention will be described with reference to FIGS. 1 to 3.

Figure 1:
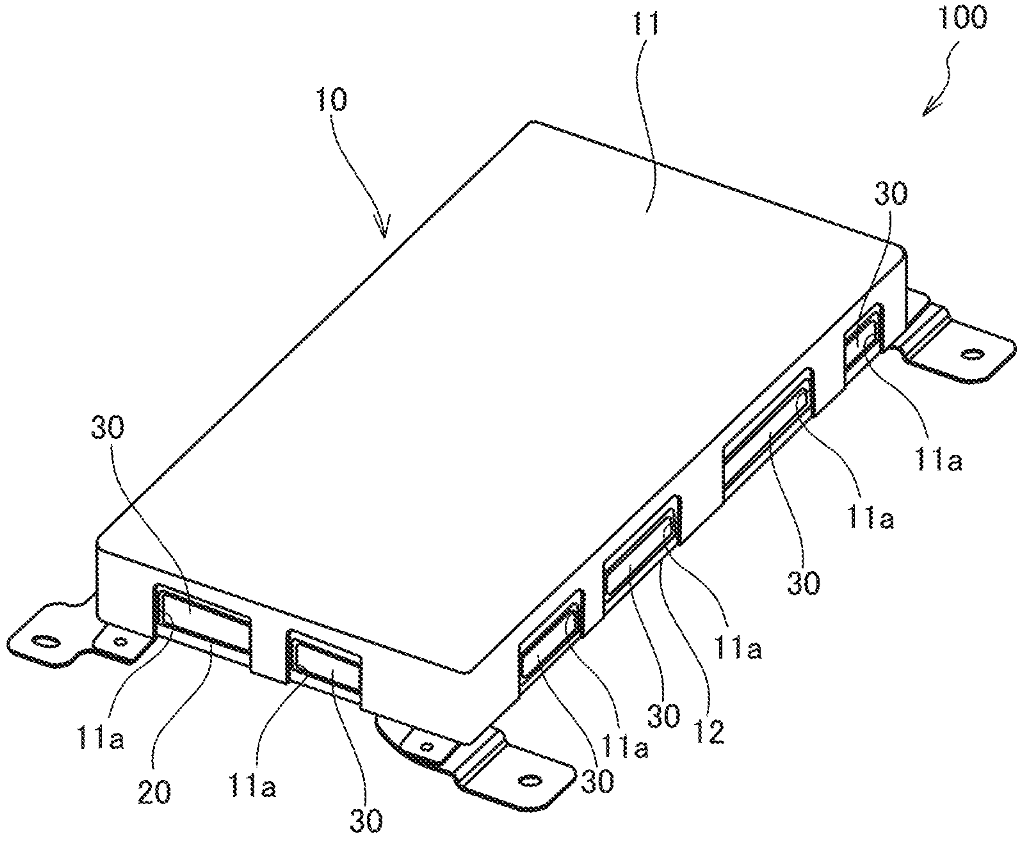
FIG. 1 is a perspective view of an in-vehicle electronic device according to an embodiment of the present invention.

FIG. 1 is a perspective view of the electronic device 100. FIG. 2 is an exploded perspective view of the electronic device 100. FIG. 3 is a plan view illustrating a state where an upper case 11 of the electronic device 100 is detached.

The electronic device 100 is mounted on a vehicle and is disposed in a vehicle interior (not illustrated). The electronic device 100 is, for example, a battery management system (BMS) that controls a driving battery of an electric vehicle (EV), a hybrid electric vehicle (HEV), or the like.

Figure 2:
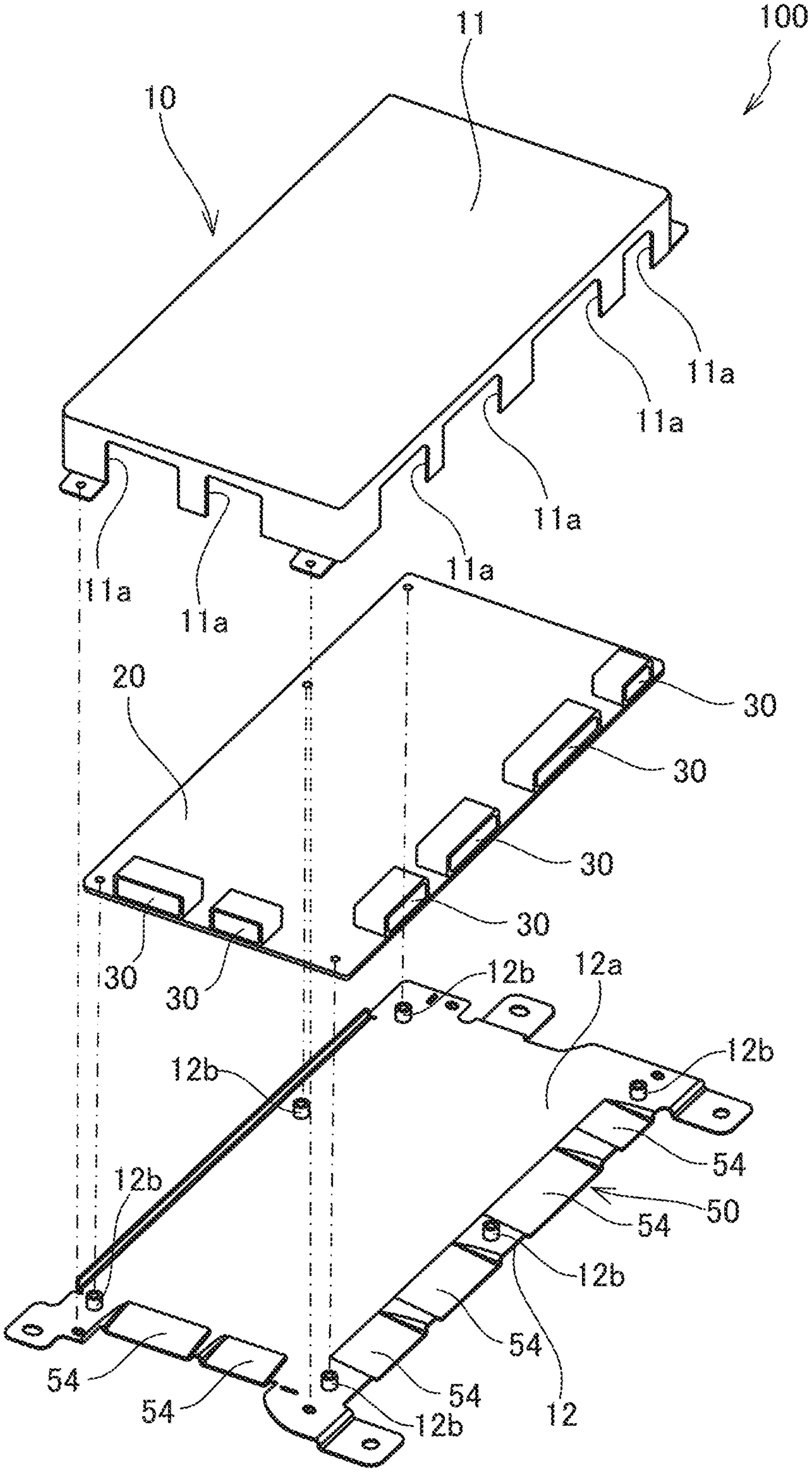
FIG. 2 is an exploded perspective view of the in-vehicle electronic device.

As illustrated in FIGS. 1 and 2, the electronic device 100 includes a case 10, a circuit board 20, a connector 30, and a drain mechanism 50 (see FIG. 2).

The case 10 accommodates the circuit board 20 and the connector 30. The case 10 includes the upper case 11 and a lower case 12.

The upper case 11 is located above the circuit board 20. The upper case 11 is formed in a substantially box shape. The upper case 11 covers an upper surface of the circuit board 20. A plurality of (here, six) notches 11*a* for exposing an opening 32 of the connector 30 to the outside of the case 10 are formed in the upper case 11.

The lower case 12 is located below the circuit board 20. The lower case 12 is formed in a substantially flat plate shape. The lower case 12 covers a lower surface of the circuit board 20. The lower case 12 is bolted to the upper case 11 with the circuit board 20 interposed therebetween.

As illustrated in FIG. 2, the lower case 12 includes a flat plate portion 12*a* and a plurality of (here, six) bosses 12*b* that support the circuit board 20. The boss 12*b* is provided in a substantially cylindrical shape, and a female screw (not illustrated) for bolting is formed on an inner periphery thereof. The lower case 12 supports the circuit board 20 to be located on an upper surface of the boss 12*b*. The flat plate portion 12*a* is provided with a drain part 54 (described later) of the drain mechanism 50.

The circuit board 20 is formed in a substantially flat plate shape. On the circuit board 20, a circuit pattern (not illustrated) is formed, and various electronic components (not illustrated) necessary for the electronic device 100 to execute control are mounted. The circuit board 20 is supported on the boss 12*b* of the lower case 12, and is fastened and attached to the boss 12*b* by bolts (not illustrated). Accordingly, the circuit board 20 is supported on the lower case 12 in a state of being spaced apart from the flat plate portion 12*a* in a height direction.

Figure 3:
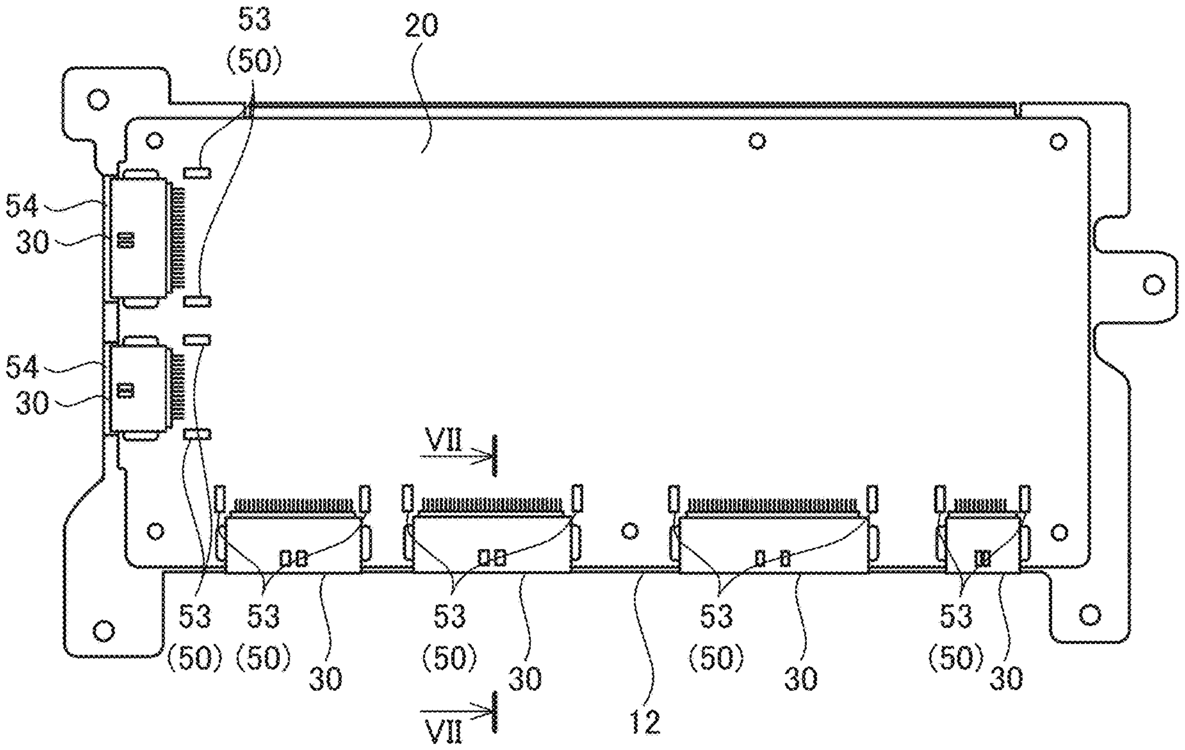
FIG. 3 is a plan view illustrating a state where an upper case of the in-vehicle electronic device is detached.

As illustrated in FIG. 3, the connector 30 is mounted on the upper surface of the circuit board 20. A plurality of (here, six) connectors 30 are provided along an outer peripheral edge of the circuit board 20. A retainer 40 (see FIG. 8) described later is inserted into each connector 30. The connector 30 is used to electrically connect the circuit board 20 to another external electronic device (not illustrated).

Next, configurations of the connector 30, the retainer 40, and the drain mechanism 50 will be described with reference to FIGS. 3 to 10.

Figure 4:
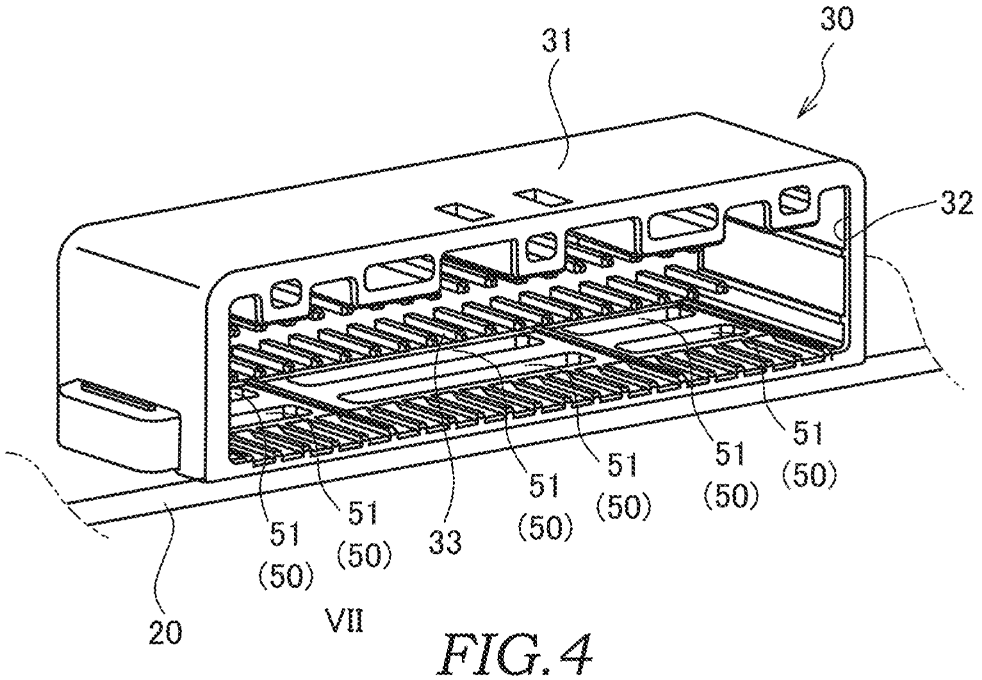
FIG. 4 is an enlarged perspective view illustrating a structure in the vicinity of a connector of the in-vehicle electronic device.
Figure 5:
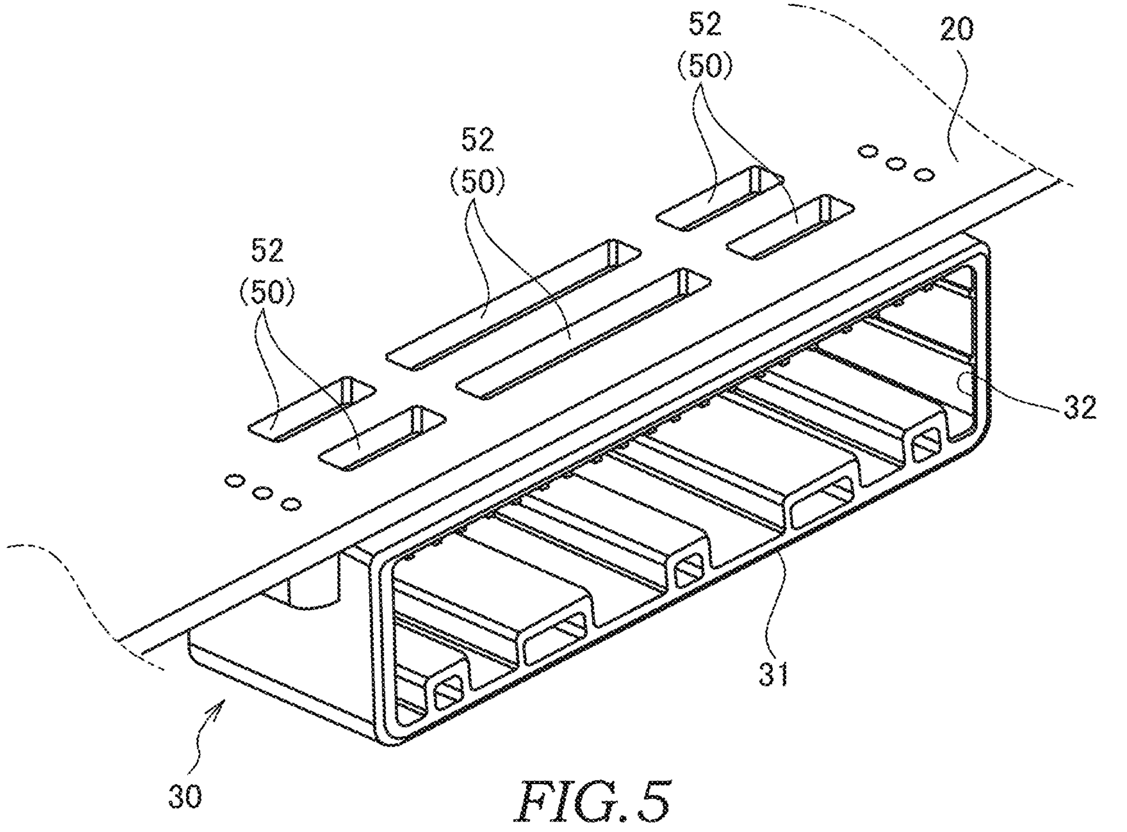
FIG. 5 is a perspective view of the structure in the vicinity of the connector illustrated in FIG. 4 as viewed obliquely from below.
Figure 6:
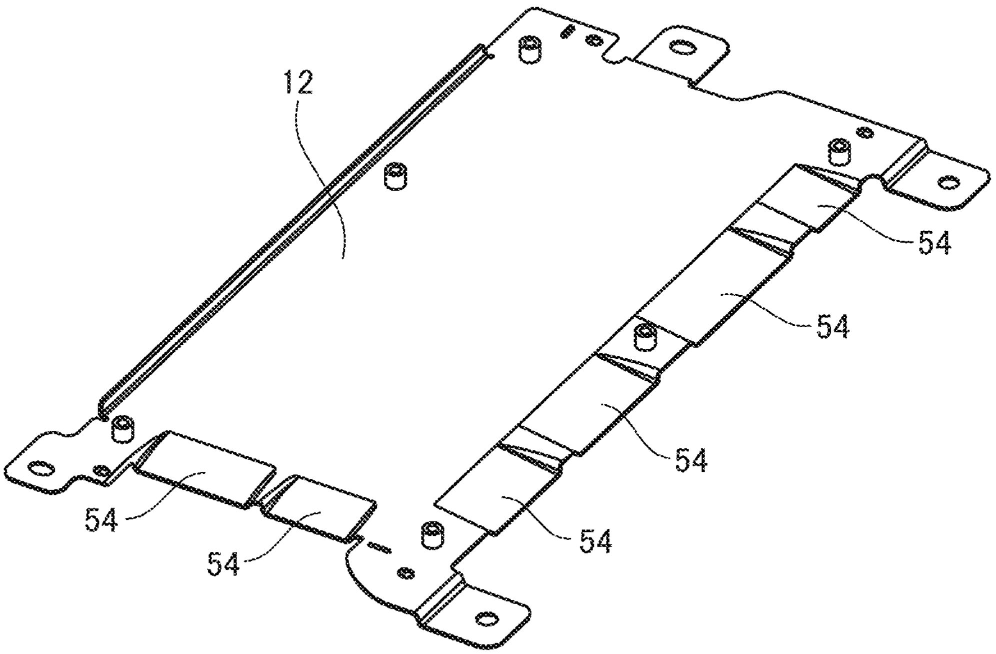
FIG. 6 is a perspective view of a lower case of the in-vehicle electronic device.
Figure 7:
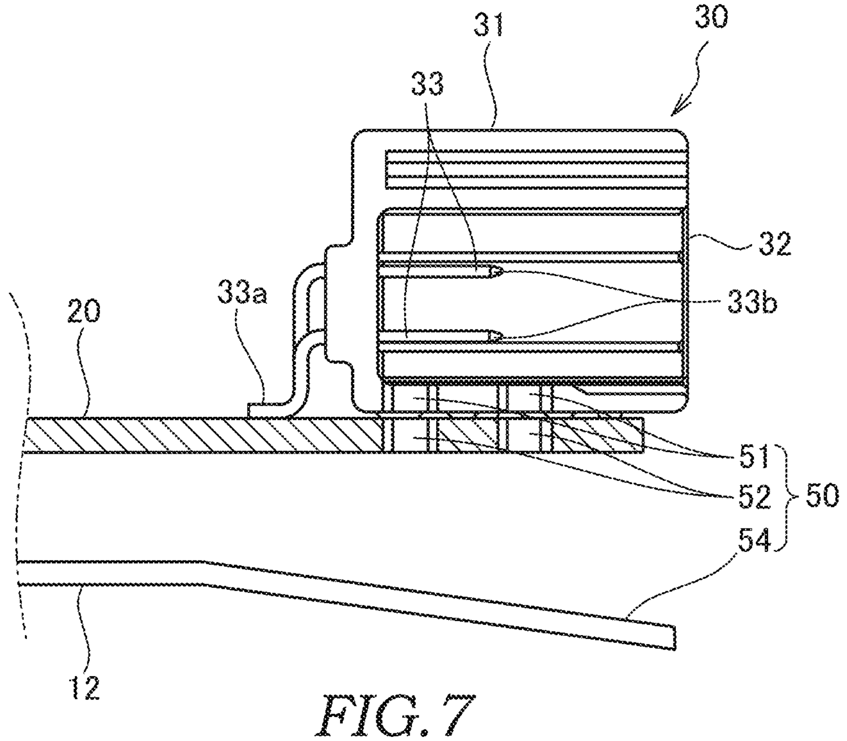
FIG. 7 is a sectional view taken along a line VII-VII in FIG. 3.
Figure 8:
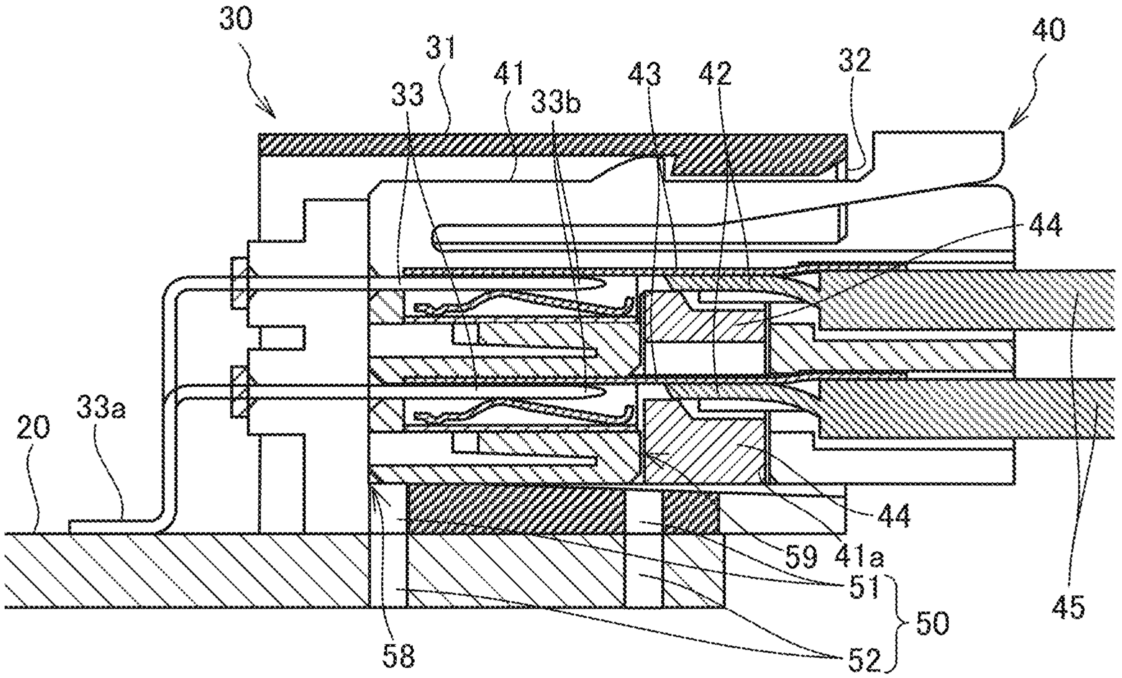
FIG. 8 is a sectional view illustrating a state where a retainer is inserted into the connector.
Figure 9:
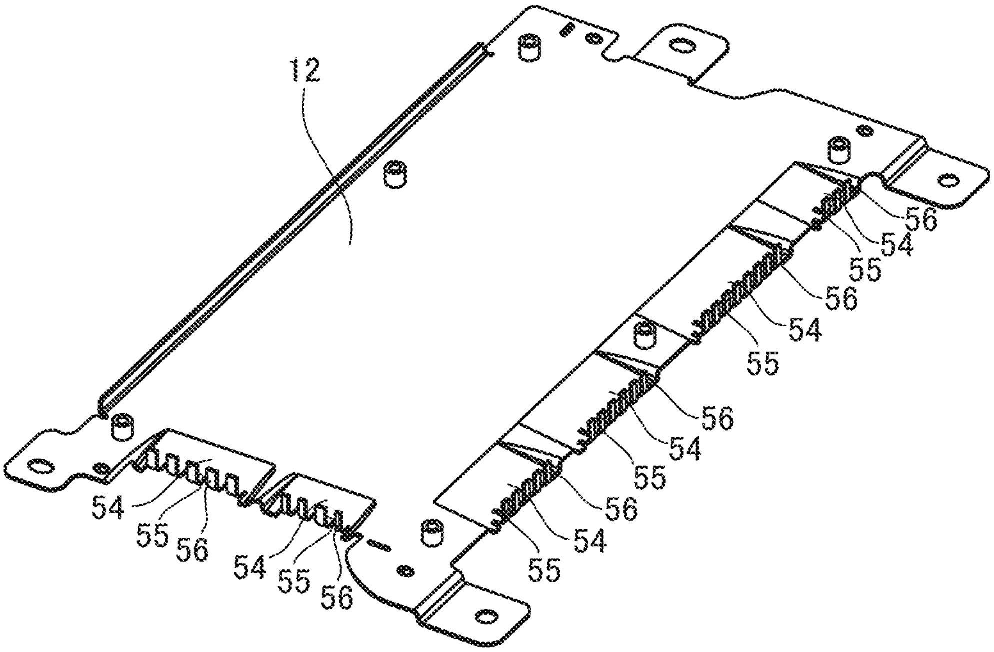
FIG. 9 is a perspective view of a lower case of an in-vehicle electronic device according to a modification of the embodiment of the present invention.
Figure 10:
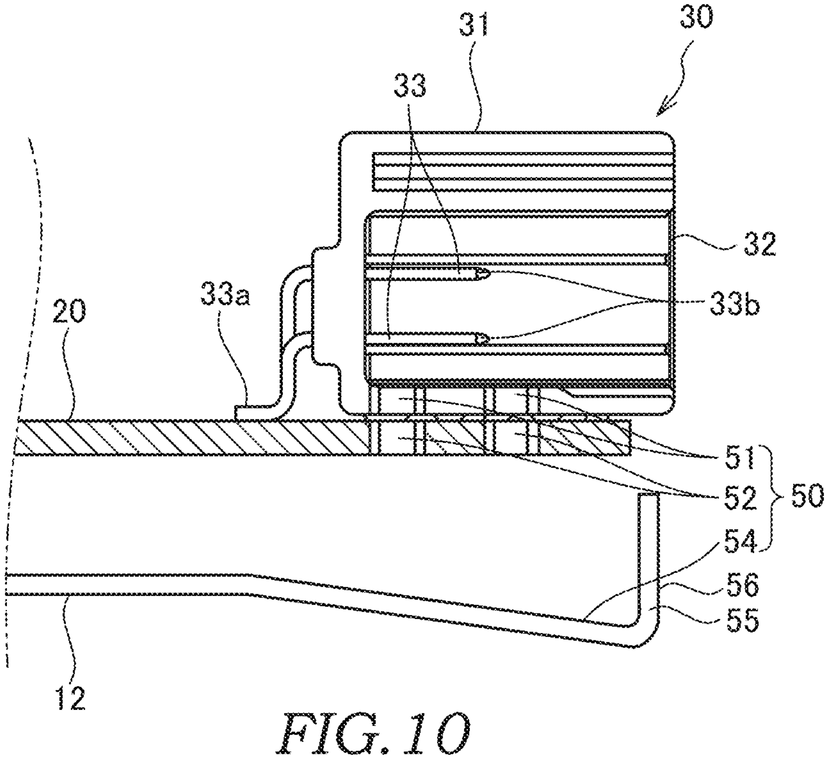
FIG. 10 is a view illustrating the same section as FIG. 7 in the in-vehicle electronic device according to the modification.

FIG. 4 is an enlarged perspective view illustrating a structure in the vicinity of the connector 30 of the electronic device 100. FIG. 5 is a perspective view of the structure in the vicinity of the connector 30 illustrated in FIG. 4 as viewed obliquely from below. FIG. 6 is a perspective view of the lower case 12 of the electronic device 100. FIG. 7 is a sectional view taken along a line VII-VII in FIG. 3. FIG. 8 is a sectional view illustrating a state where the retainer 40 is inserted into the connector 30. FIG. 9 is a perspective view of the lower case 12 in the electronic device 100 according to a modification. FIG. 10 is a diagram illustrating the same cross section as FIG. 7 in the electronic device 100 according to the modification.

As illustrated in FIGS. 4 and 5, the connector 30 includes a connector main body 31 and a plurality of connector pins 33.

The connector main body 31 is formed of a resin material. The connector main body 31 is formed in a substantially rectangular parallelepiped shape. The connector main body 31 has an opening 32.

The opening 32 is opened in a substantially rectangular shape to be exposed to the outside of the case 10. The retainer 40 (see FIG. 8) is inserted into the opening 32.

As illustrated in FIG. 4, the connector pins 33 protrude toward the opening 32 in the connector main body 31. The connector pins 33 are arranged in a matrix of n rows×m columns (n and m are positive integers). As illustrated in FIG. 7, one end portion 33*a* of the connector pin 33 is electrically connected to the circuit pattern formed on the upper surface of the circuit board 20. As illustrated in FIG. 8, the other end portion 33*b* of the connector pin 33 is electrically connected to another external electronic device via the retainer 40 in a state where the retainer 40 is inserted into the connector 30.

As illustrated in FIG. 8, the retainer 40 includes a retainer main body 41 as a main body portion, a first terminal portion 42, a second terminal portion 43, and a crimping portion 44.

The retainer main body 41 is formed in a substantially rectangular parallelepiped shape slightly smaller than the connector main body 31. The retainer main body 41 is inserted into the connector 30. The retainer main body 41 has, at substantially the center thereof in a longitudinal direction, a recess 41*a* for inserting the crimping portion 44.

The first terminal portion 42 is disposed in the retainer main body 41. The first terminal portion 42 is electrically connected to the harness 45.

The second terminal portion 43 is electrically connected to the connector pin 33 in the connector 30 in a state where the retainer 40 is inserted into the connector 30 (state illustrated in FIG. 8).

The crimping portion 44 presses the first terminal portion 42 against the second terminal portion 43 in a state where the crimping portion 44 is attached to the recess 41*a* of the retainer main body 41 (state illustrated in FIG. 8). That is, the crimping portion 44 fixes the first terminal portion 42 and the second terminal portion 43 in a state where the first terminal portion 42 and the second terminal portion 43 are in contact with each other.

Here, for example, when the vehicle is submerged, water may enter the electronic device 100. In a case where the vehicle returns from the submerged state, when water entering the electronic device 100 stays inside the electronic device, a leakage current may flow through a path through which the water does not originally flow. Therefore, the electronic device 100 is provided with the drain mechanism 50 in order to prevent the entered water from staying inside when the vehicle returns from the submerged state.

As illustrated in FIG. 7, the drain mechanism 50 is provided to face a current-carrying part that allows electricity to flow therethrough, and drains water to the outside of the case 10. Here, the connector pin 33 of the connector 30 and the first terminal portion 42 of the retainer 40 correspond to the current-carrying part. The drain mechanism 50 has a first drain hole 51, a second drain hole 52, a third drain hole 53, and a drain part 54.

As illustrated in FIG. 4, the first drain hole 51 is provided in the connector main body 31 of the connector 30. The first drain hole 51 is formed in an elongated hole shape along the direction in which the connector pins 33 are arranged. The first drain hole 51 is formed in the connector 30 to be divided into a plurality of (here, three) drain holes arranged in the longitudinal direction. As illustrated in FIG. 7, the first drain hole 51 is provided to vertically penetrate a lower surface of the connector 30. The first drain hole 51 drains water entering the connector 30 to the outside by gravity.

In this manner, since the first drain hole 51 vertically penetrating the lower surface of the connector 30 is provided, water entering the connector 30 can be guided to the outside of the connector 30 by gravity and drained. Therefore, when the vehicle returns from the submerged state, the entered water can be prevented from staying inside the connector 30.

As illustrated in FIG. 8, the first drain hole 51 is provided to be opened to a first position 58 communicating with an abutting surface between a tip end portion of the retainer 40 and an inner surface of the connector 30 and a second position 59 communicating with a facing surface of the retainer main body 41 and the crimping portion 44. The first drain hole 51 may be provided to be opened only to the first position 58 or the second position 59. That is, the first drain hole 51 is provided to be opened to at least one of the first position 58 and the second position 59.

In this manner, since the first drain hole 51 is opened to at least one of the first position 58 and the second position 59 where water is unlikely to be drained to the outside when water enters the connector 30, water staying in the connector pin 33 and the first terminal portion 42 that allow electricity to flow therethrough in the electronic device 100 can be guided to the outside and drained. Therefore, when the vehicle returns from the submerged state, the entered water can be prevented from staying in the vicinity of the connector pin 33 and the first terminal portion 42.

As illustrated in FIG. 5, the second drain hole 52 is provided in the circuit board 20. The second drain hole 52 is formed in the same elongated hole shape as the first drain hole 51. The second drain hole 52 is formed in substantially the same shape as the first drain hole 51. As illustrated in FIGS. 7 and 8, the second drain hole 52 is provided at a position communicating with the first drain hole 51 of the connector 30 in a vertical direction. The second drain hole 52 is provided to vertically penetrate the circuit board 20. The second drain hole 52 drains water drained from the connector 30 via the first drain hole 51 to the outside by gravity.

In this manner, since the second drain hole 52 vertically penetrating the circuit board 20 is provided, the water drained from the connector 30 through the first drain hole 51 can be guided to below the circuit board 20 by gravity and drained. Therefore, when the vehicle returns from the submerged state, the entered water can be prevented from staying on the circuit board 20.

As illustrated in FIGS. 6 and 7, the drain part 54 is formed on the lower case 12. The drain part 54 guides the water drained from the first drain hole 51 and the second drain hole 52 to the outside of the case 10. The drain part 54 is an inclined surface opened to a lateral side of the case 10. The drain part 54 is inclined to be gradually separated from the circuit board 20 toward the lateral side of the case 10, that is, such that an opening area gradually increases toward the lateral side of the case 10.

In this manner, since the lower case 12 is provided with the drain part 54, the water guided to below the circuit board 20 through the first drain hole 51 and the second drain hole 52 can be guided to the outside of the case 10 by gravity and drained. Therefore, when the vehicle returns from the submerged state, the entered water can be prevented from staying in the case 10.

As described above, the electronic device 100 includes the drain mechanism 50 for discharging water to the outside of the case 10, the drain mechanism 50 being provided to face the connector pin 33 and the first terminal portion 42 of the circuit board 20, which allow electricity to flow therethrough. Therefore, even when water enters the inside of the case 10, water staying in the current-carrying part (connector pin 33 and first terminal portion 42) of the circuit board 20, which allows electricity to flow therethrough, is drained to the outside of the case 10 through the drain mechanism 50. Therefore, it is possible to prevent occurrence of a leakage current and to prevent an increase in the size of the electronic device 100.

When the vehicle returns from the submerged state and a worker pulls out the retainer 40 from the connector 30 to disassemble the connector 30 and the retainer 40, the water entering the connector 30 is already guided to the outside of the connector 30 and drained. Therefore, the worker can safely perform work.

As in the modification illustrated in FIGS. 9 and 10, the drain part 54 may include a plurality of slit portions 55 provided to be intermittently opened.

The slit portions 55 are formed among a plurality of claw portions 56 that are intermittently folded back at opening ends of the drain part 54. In this manner, the drain part 54 is implemented by the plurality of slit portions 55, so that an opening area of the drain part 54 is reduced, and thus it is possible to prevent a finger or the like of the worker from entering from the outside. Therefore, it is possible to prevent the worker from touching the current-carrying part in the case 10.

As illustrated in FIG. 3, the third drain hole 53 is provided between connection portions (connection portions between end portion 33*a* and circuit pattern of circuit board 20) at which the connector pins 33 of the pair of the connectors 30 adjacent to each other are electrically connected to the circuit board 20. Here, the one end portion 33*a* (see FIGS. 7 and 8) of the connector pin 33 corresponds to the current-carrying part. The third drain hole 53 is provided to vertically penetrate the circuit board 20. The third drain hole 53 drains water staying on the circuit board 20 to the outside by gravity.

In this manner, since the third drain hole 53 vertically penetrating the circuit board 20 is provided between the connection portions, the water staying on the circuit board 20 can be guided to below the circuit board 20 by gravity through the third drain hole 53 and drained. Therefore, when the vehicle returns from the submerged state, the entered water can be prevented from staying on the circuit board 20.

Next, first to third modifications of the drain part 54 will be described with reference to FIGS. 11 to 13.

Figure 11:
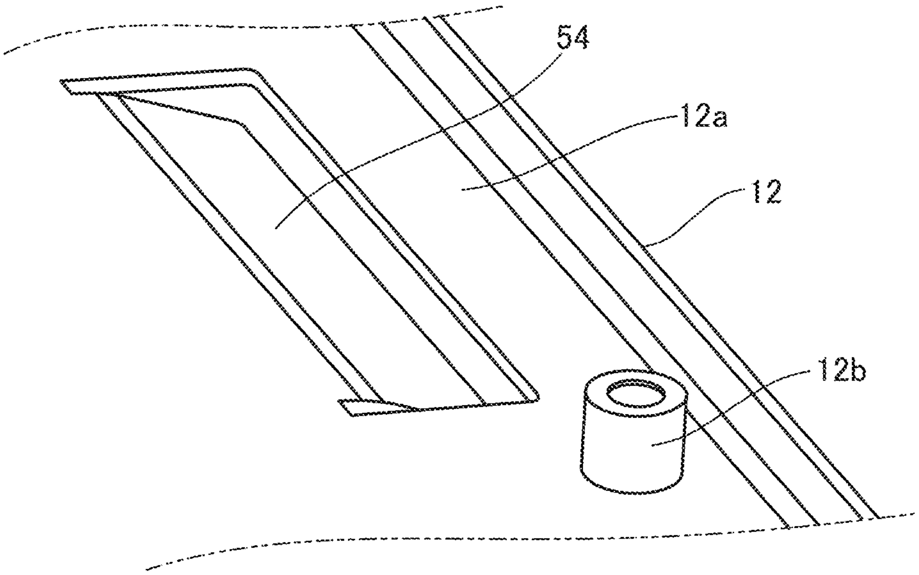
FIG. 11 is a perspective view illustrating a first modification of a drain part provided on the lower case.

FIG. 11 is a perspective view illustrating a first modification of the drain part 54 provided on the lower case 12. FIG. 12 is a perspective view illustrating a second modification of the drain part 54 provided on the lower case 12. FIG. 13 is a perspective view illustrating a third modification of the drain part 54 provided on the lower case 12.

As illustrated in FIG. 11, the drain part 54 may be an inclined surface that is formed at an inner side of an outer peripheral edge of the lower case 12 and opened to below the flat plate portion 12*a* instead of being opened to a side end surface of the lower case 12. In this case, similarly, the water guided to below the circuit board 20 through the first drain hole 51 and the second drain hole 52 can also be guided to the outside of the case 10 by gravity and drained.

Figure 12:
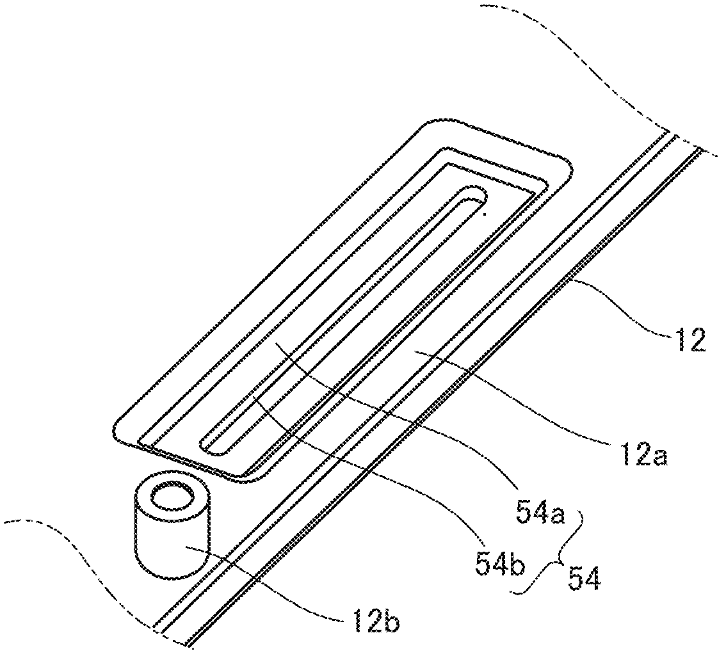
FIG. 12 is a perspective view illustrating a second modification of the drain part provided on the lower case.

As illustrated in FIG. 12, the drain part 54 may be formed by a lower step surface 54*a* protruding downward from the flat plate portion 12*a* and an opening 54*b* having an elongated hole shape opened to the lower step surface 54*a*. In this case, the water guided to below the circuit board 20 through the first drain hole 51 and the second drain hole 52 is guided to the lower step surface 54*a* by gravity. Then, the water collected on the lower step surface 54*a* can be guided to the outside of the case 10 through the opening 54*b* by gravity and drained.

Figure 13:
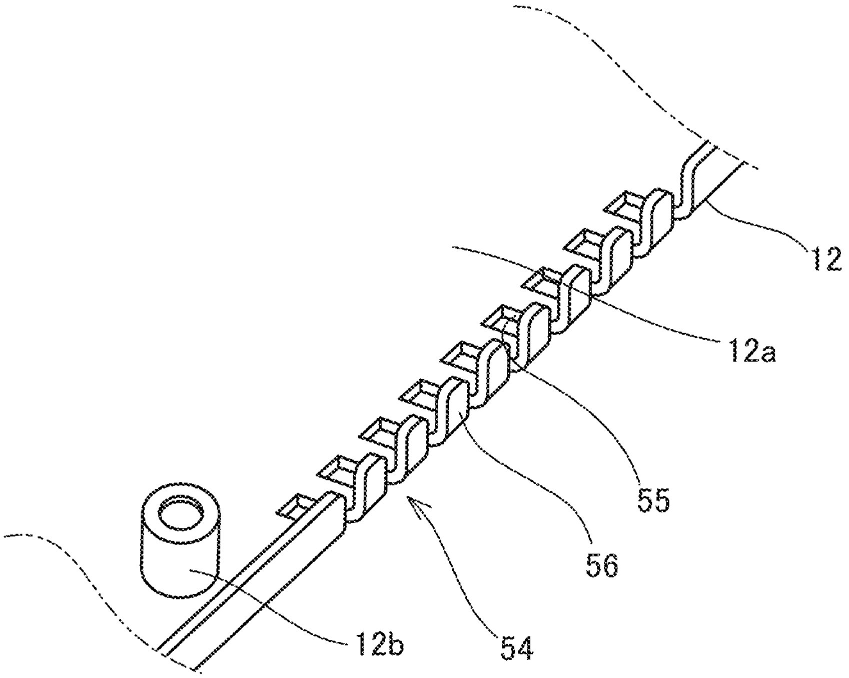
FIG. 13 is a perspective view illustrating a third modification of the drain part provided on the lower case.

As illustrated in FIG. 13, the drain part 54 may be a plurality of slit portions 55 provided by forming a plurality of claw portions 56 at an end portion of the flat plate portion 12*a* of the lower case 12. In this case, the drain part 54 is not inclined with respect to the flat plate portion 12*a*, but the electronic device 100 itself may be inclined depending on a position where the electronic device 100 is disposed. Therefore, only by providing the claw portion 56 and the slit portion 55 without forming the inclined surface, the water guided to below the circuit board 20 through the first drain hole 51 and the second drain hole 52 can be guided to the outside of the case 10 by gravity and drained using inclination of the electronic device 100 itself.

According to the above embodiments, the following effects are exerted.

The electronic device 100 includes the connector 30 into which the retainer 40 is inserted, the circuit board 20 on which the connector 30 is mounted, the case 10 accommodating the circuit board 20 and the connector 30 such that the opening 32 into which the retainer 40 of the connector 30 is inserted is exposed to outside, and the drain mechanism 50 configured to drain water to the outside of the case 10 and provided to face a current-carrying part configured to allow electricity to flow therethrough.

In this configuration, the electronic device 100 includes the drain mechanism 50 configured to drain water to the outside of the case 10 and provided to face the current-carrying part of the circuit board 20, which allows electricity to flow therethrough. Therefore, even when water enters the inside of the case 10, the water in the current-carrying part of the circuit board 20, which allows electricity to flow therethrough, is drained to the outside of the case 10 through the drain mechanism 50. Therefore, it is possible to prevent occurrence of a leakage current and to prevent an increase in the size of the electronic device 100.

The drain mechanism 50 has a first drain hole 51 that is provided to vertically penetrate a lower surface of the connector 30 and drains water entering the connector 30 to the outside.

According to this configuration, since the first drain hole 51 vertically penetrating the lower surface of the connector 30 is provided, water entering the connector 30 can be guided to the outside of the connector 30 by gravity and drained. Therefore, when the vehicle returns from the submerged state, the entered water can be prevented from staying inside the connector 30.

When the vehicle returns from the submerged state and a worker pulls out the retainer 40 from the connector 30 to disassemble the connector 30 and the retainer 40, the water entering the connector 30 is already guided to the outside of the connector 30 and drained. Therefore, the worker can safely perform work.

The connector 30 is mounted on an upper surface of the circuit board 20, and the drain mechanism 50 has the second drain hole 52 provided to vertically penetrate the circuit board 20 at a position communicating with the first drain hole 51 in a vertical direction.

According to this configuration, since the second drain hole 52 vertically penetrating the circuit board 20 is provided, the water drained from the connector 30 through the first drain hole 51 can be guided to below the circuit board 20 by gravity and drained. Therefore, when the vehicle returns from the submerged state, the entered water can be prevented from staying on the circuit board 20.

The case 10 includes the lower case 12 located below the circuit board 20, and the drain mechanism 50 includes the drain part 54 formed in the lower case 12 and configured to guide water drained from the second drain hole 52 to the outside of the case 10.

According to this configuration, since the lower case 12 is provided with the drain part 54, the water guided to below the circuit board 20 through the first drain hole 51 and the second drain hole 52 can be guided to the outside of the case 10 by gravity and drained. Therefore, when the vehicle returns from the submerged state, the entered water can be prevented from staying in the case 10.

The drain part 54 includes a plurality of slit portions 55 provided to be intermittently opened.

According to this configuration, since the drain part 54 includes the plurality of slit portions 55 and an opening area of the drain part 54 is reduced, it is possible to prevent a finger or the like of a worker from entering from the outside. Therefore, it is possible to prevent the worker from touching the current-carrying part in the case 10.

The retainer 40 includes the retainer main body 41 inserted into the connector 30, and the crimping portion 44 disposed in the retainer main body 41 and configured to fix the first terminal portion 42 connected to the harness 45 and the second terminal portion 43 in a state where the first terminal portion 42 and the second terminal portion 43 are in contact with each other, the second terminal portion 43 being connected to the connector pin 33 in the connector 30 in a state of being inserted into the connector 30. The first drain hole 51 is provided to be opened to at least one of the first position 58 communicating with an abutting surface between a tip end portion of the retainer 40 and an inner surface of the connector 30 and the second position 59 communicating with a facing surface of the retainer main body 41 and the crimping portion 44.

According to this configuration, since the first drain hole 51 is opened to at least one of the first position 58 and the second position 59 where water is unlikely to be drained to the outside when water enters the connector 30, water staying in the current-carrying part which allows electricity to flow therethrough in the electronic device 100 can be guided to the outside and drained. Therefore, when the vehicle returns from the submerged state, the entered water can be prevented from staying in the vicinity of the current-carrying part.

A plurality of the connectors 30 are provided along an outer peripheral edge of the circuit board 20, and the drain mechanism 50 has the third drain hole 53 provided to vertically penetrate the circuit board 20 between connection portions where the connector pins 33 of the pair of the connectors 30 adjacent to each other are electrically connected to the circuit board 20.

According to this configuration, since the third drain hole 53 vertically penetrating the circuit board 20 is provided between the connection portions, the water staying on the circuit board 20 can be guided to below the circuit board 20 by gravity through the third drain hole 53 and drained. Therefore, when the vehicle returns from the submerged state, the entered water can be prevented from staying on the circuit board 20.

The present invention is not limited to the embodiments described above, and it goes without saying that various modifications can be made within the scope of the technical idea described in the claims.

For example, in the above embodiment, the case where the electronic device 100 is a battery management system has been described. However, the electronic device 100 may be any electronic device as long as it is mounted on a vehicle.

The invention claimed is:

1. An in-vehicle electronic device comprising:

a connector into which a retainer is inserted;

a circuit board on which the connector is mounted;

a case accommodating the circuit board and the connector such that an opening of the connector through which the retainer is inserted is exposed to outside; and a drain mechanism configured to drain water to the outside of the case and provided to face a current-carrying part configured to allow electricity to flow therethrough, wherein the drain mechanism has a first drain hole provided to vertically penetrate a lower surface of the connector and configured to allow water entering the connector to be drained to the outside, the retainer includes:

a main body portion inserted into the connector; and a crimping portion disposed in the main body portion and configured to fix a first terminal portion connected to a harness and a second terminal portion in a state where the first terminal portion and the second terminal portion are in contact with each other, the second terminal portion being connected to a connector pin in the connector in a state of being inserted into the connector, and the first drain hole is provided to be opened to at least one of a first position communicating with an abutting surface between a tip end portion of the retainer and an inner surface of the connector and a second position communicating with a facing surface between the main body portion and the crimping portion.

2. The in-vehicle electronic device according to claim 1, wherein the connector is mounted on an upper surface of the circuit board, and the drain mechanism has a second drain hole provided to vertically penetrate the circuit board at a position communicating with the first drain hole in a vertical direction.

3. The in-vehicle electronic device according to claim 2, wherein the case includes a lower case located below the circuit board, and the drain mechanism includes a drain part formed in the lower case and configured to guide water drained from the second drain hole to the outside of the case.

4. The in-vehicle electronic device according to claim 3, wherein the drain part includes a plurality of slit portions provided to be intermittently opened.

5. The in-vehicle electronic device according to claim 1, wherein a plurality of connectors are provided along an outer peripheral edge of the circuit board, and the drain mechanism has a third drain hole provided to vertically penetrate the circuit board between connection portions at which connector pins of a pair of plurality of the connectors adjacent to each other are electrically connected to the circuit board.

* * * * *